(12) United States Patent
Zehavi et al.

(10) Patent No.: US 8,476,660 B2
(45) Date of Patent: Jul. 2, 2013

(54) PHOTOVOLTAIC CELL ON SUBSTRATE

(75) Inventors: Sharone Zehavi, San Jose, CA (US);
Jerome S. Culik, San Jose, CA (US);
Raanan Y. Zehavi, San Jose, CA (US)

(73) Assignee: Integrated Photovoltaics, Inc., San Jose, CA (US)

( * ) Notice: Subject to any disclaimer, the term of this patent is extended or adjusted under 35 U.S.C. 154(b) by 303 days.

(21) Appl. No.: 12/860,048

(22) Filed: Aug. 20, 2010

(65) Prior Publication Data
US 2011/0041903 A1 Feb. 24, 2011

Related U.S. Application Data

(60) Provisional application No. 61/235,610, filed on Aug. 20, 2009, provisional application No. 61/239,739, filed on Sep. 3, 2009.

(51) Int. Cl.
*H01L 33/00* (2006.01)

(52) U.S. Cl.
USPC ............... 257/98; 257/99; 257/103; 257/347; 257/431

(58) Field of Classification Search
USPC ............... 257/12–13, 98–99, 103, 91, 95–96, 257/431–433, 347, 344, 81, 84, 88–89; 438/22–29, 406, 761, 455–459
See application file for complete search history.

(56) References Cited

U.S. PATENT DOCUMENTS

| | | | |
|---|---|---|---|
| 3,078,328 A | 2/1963 | Jones | |
| 4,003,770 A | 1/1977 | Janowiecki | |
| 4,077,818 A | 3/1978 | Chu | |
| 5,057,163 A | 10/1991 | Barnett | |
| 6,552,369 B2 * | 4/2003 | Chiou et al. | 257/98 |
| 6,784,462 B2 * | 8/2004 | Schubert | 257/98 |
| 7,642,561 B2 * | 1/2010 | Lee et al. | 257/98 |
| 2004/0142503 A1 * | 7/2004 | Lee et al. | 438/47 |
| 2006/0118802 A1 * | 6/2006 | Lee et al. | 257/98 |
| 2008/0023070 A1 | 1/2008 | Sinha | |
| 2008/0054106 A1 | 3/2008 | Zehavi | |
| 2008/0072953 A1 | 3/2008 | Stephens | |
| 2008/0220558 A1 | 9/2008 | Zehavi | |
| 2008/0295882 A1 | 12/2008 | Stephens | |
| 2010/0059107 A1 | 3/2010 | Barnett | |

OTHER PUBLICATIONS

"Silicon-Film™ Solar Cells by a Flexible Manufacturing System"; J. Rand, AstroPower, Inc.; NREL/SR-520-30881; Feb. 2002.
"Thermal Simulation Model of a Roll-to-Roll Silicon Thin-Flim Solar Cell Deposition Reactor"; Nadir, K.; 2007 Society of Vacuum Coaters; 50th Annual Technical Conference Proceedings (2007); ISSN 0737-5921,192-194.
Tamura, F.; "Fabrication of poly-crystalline silicon films using plasma spray method"; Solar Energy Materials and Solar Cells, 34 (1994) 263-270.

* cited by examiner

*Primary Examiner* — Dung A. Le
(74) *Attorney, Agent, or Firm* — Fernandez & Associates, LLP

(57) ABSTRACT

A photovoltaic device on a non-semiconductor substrate is disclosed. The device comprises two semiconductor layers forming an active region; at least one of the semiconductor layers is formed by a high-purity plasma spray process; optional layers include one or more barrier layers, a cap layer, a conductive and/or metallization layer, an anti-reflection layer, and distributed Bragg reflector. The device may comprise multiple active regions.

13 Claims, 10 Drawing Sheets

Figure 1  Structure of plasma flame generating mechanism

Figure 3   Basic building blocks of a phenolic resin

| steps/layers 101 or 102 | | Optional Steps |
|---|---|---|
| 104 | Select substrate | |
| 105 | | Substrate barrier layer |
| 107 | | 1st conductive layer |
| 108 | | deposit 1st barrier layer |
| 110 | deposit 1st semiconductor layer | form vias |
| 111 | | (1st conductivity) |
| 152 | | form/deposit cap layer |
| 115 | | Recrystallize 1st layer |
| 330 | | p-type layer |
| 335 | | deposit semiconductor barrier layer |
| 120 | deposit 2nd semiconductor layer | form vias |
| 331 | | (2nd conductivity) |
| 336 | | deposit 3rd barrier layer |
| 125 | | form vias |
| 140 | | deposit contact layer |
| 145 | | deposit anti-reflection layer |
| | | metallization layer |

Figure 10

PHOTOVOLTAIC CELL ON SUBSTRATE

PRIORITY

This application claims priority from U.S. Provisional Applications 61/235,610 and 61/239,739 filed on Aug. 20, 2009 and Sep. 3, 2009 respectively.

CROSS-REFERENCE TO RELATED APPLICATIONS

This application is related in part to U.S. Applications 11/782,201, 12/074,651, 12/720,153, 12/749,160, 12/789,357, 61/235,610, 61/239,739 and U.S. Application titled "Photovoltaic Cell", Ser. No. 12/860,088, filed on Aug. 20, 2010, all owned by the same assignee and incorporated by reference in their entirety herein. Additional technical explanation and background is cited in the referenced material.

BACKGROUND OF THE INVENTION

1. Field of the Invention

The invention relates generally to a photovoltaic device formed by the deposition of semiconductor based layers on a substrate. More specifically, the invention relates to the deposition and recrystallization of silicon to form solar devices on a non-semiconductor substrate, discrete platens or continuous sheet.

2. Description of Related Art

Prior art in this area includes U.S.2010/0059107; U.S. 2008/0295882; U.S.2008/0072953; U.S.2008/0023070. Preceding references incorporated in their entirety herein by reference. None of the cited prior art effectively addresses the primary issue for solar cells, namely low manufacturing cost coupled with commercial level conversion efficiency; solar cell module costs must be below $0.50/watt to begin to achieve parity with conventional utility pricing.

Plasma spraying has been discussed for many years for forming silicon semiconducting devices including silicon solar cells. Such efforts have not found ready commercialization because of the low quality of the sprayed silicon. Interest in plasma sprayed semiconducting silicon has been rekindled recently in the hope of providing a low cost manufacturing method for silicon solar cells. Zehavi et al. have reported recent efforts in plasma spraying high-quality silicon in U.S. 2008/0220558.

Tamura, "Fabrication of poly-crystalline silicon films using plasma spray method"; Solar Energy Materials and Solar Cells, 34 (1994) 263-270, investigated solar cells on graphite substrates, particularly glassy graphite and woven graphite. While feasibility was demonstrated, serious obstacles prevented commercialization of the disclosed processes. Among the obstacles disclosed were the availability of pure, or even ultra-pure, silicon powder, contamination of the deposited Si layer from the plasma spray gun, efficient utilisation of the Si powder from the deposition perspective. From the substrate perspective the primary problems were adherence to the graphite, graphite purity, and graphite integrity which results in the graphite peeling away in layers from itself, and the high cost of glassy graphite.

U.S. Applications 2008/0054106 and 2008/0220558 by Zehavi et al. demonstrate solutions to the obstacles from the deposition perspective. Chu, in U.S. Pat. No. 4,077,818, discusses deposition of silicon directly on graphite; the method consists of first applying silicon to raw graphite in order to create a surface that acts as a barrier and deposition interface for the active layers of silicon to be deposited. While this process might resolve issues of graphite impurity migration into a silicon solar cell, it still does not answer the issues of thermal expansion, CTE matching, and graphite integrity. Jones, in U.S. Pat. No. 3,078,328, discloses manufacture of solar cells in which a layer of silicon is grown onto a graphite layer from a silicon melt and doped to form a n-type layer; the melted silicon is contacted with a graphite substrate in order to generate a strong bond that includes the formation of silicon carbide (SiC) at the interface. While Jones attempts to answer the question of silicon adherence to graphite, the patent does disclose a feasible solution for the low cost manufacture of solar cells in terms of the complexity of the problem and the inherent problem of separation of graphite layers. The instant invention discloses novel methods to solve the obstacles inherent in the use of graphite substrates for solar cell manufacture.

Photovoltaic solar cells are semiconductor devices that convert sunlight into electricity. Much literature exists on the methods of manufacture and the performance of solar cells. NREL (National Renewable Energy Laboratory) of the US Dept of Energy frequently updates a chart of the best efficiencies achieved for photovoltaic devices in research labs. This chart is online at: nrel.gov/ncpv/thin_film/docs/kaz_best_research_cells.ppt; a version downloaded on Jul. 26, 2010 is FIG. 4.

From the published data, for single junction cells, single crystalline silicon is consistently the most efficient material for solar cells in terms of light to electricity conversion. For the purposes of mass production of solar cells, single crystal silicon is at a disadvantage in terms of cost. Thin film devices, while less efficient in the conversion of light into electricity, are much more cost effective for mass production.

Additional attempts have been documented in the literature, for example in Tamura, to demonstrate the feasibility of depositing a photoactive layer on inexpensive substrates to significantly reduce the cost of mass production of solar cells. Advances in the deposition techniques proposed by Tamura have been demonstrated by Zehavi et al. in U.S. 2008/0220558. In spite of the improvements found in the prior art methods, there remains a need for a barrier layer when working with a non-silicon substrate.

Dielectric barrier layers, with arrays of vias for use with conductive substrates have been disclosed in the literature. For example Barnett, U.S. Pat. No. 5,057,163 has described such a process. However, the process described did not account for diffusion of contaminants, or the potential junction created at the back plane through the barrier layer.

One innovation disclosed by the instant invention is the application of a highly conductive, doped layer, optionally silicon, between a conductive 102, optionally non-conductive 103, substrate and a substrate barrier layer 104. A substrate barrier layer improves the efficiency of the solar cell while still providing a path for photocurrent collection via a conductive substrate.

BRIEF SUMMARY OF THE INVENTION

A photovoltaic device on a substrate is disclosed. The device comprises two semiconductor layers forming an active region; at least one of the semiconductor layers is formed by a high-purity plasma spray process; optional layers include one or more barrier layers, a cap layer, a conductive layer, an anti-reflection layer, and distributed Bragg reflector. The device may comprise multiple active regions.

In one embodiment the invention discloses deposition of a layer of highly conductive, doped semiconductor onto a conductive substrate. Should the conductive substrate contain contaminants that can diffuse into active semiconductor layers, or when a substrate can create a junction with active semiconductor layers that would reduce the efficiency of the intended device, such as a solar cell, by promoting recombination, a substrate may be coated with a highly conductive layer, optionally, doped silicon, which can then be coated with a dielectric or alternative, non-conducting, barrier layer. In one embodiment, a non-contaminating and non-recombining interface is created with a barrier layer comprising an array of vias, enabling effective collection of a photocurrent.

BRIEF DESCRIPTION OF THE SEVERAL VIEWS OF THE DRAWINGS

FIG. 10 is a process flow showing optional layers and steps.

DETAILED DESCRIPTION OF THE INVENTION

Figure 1:
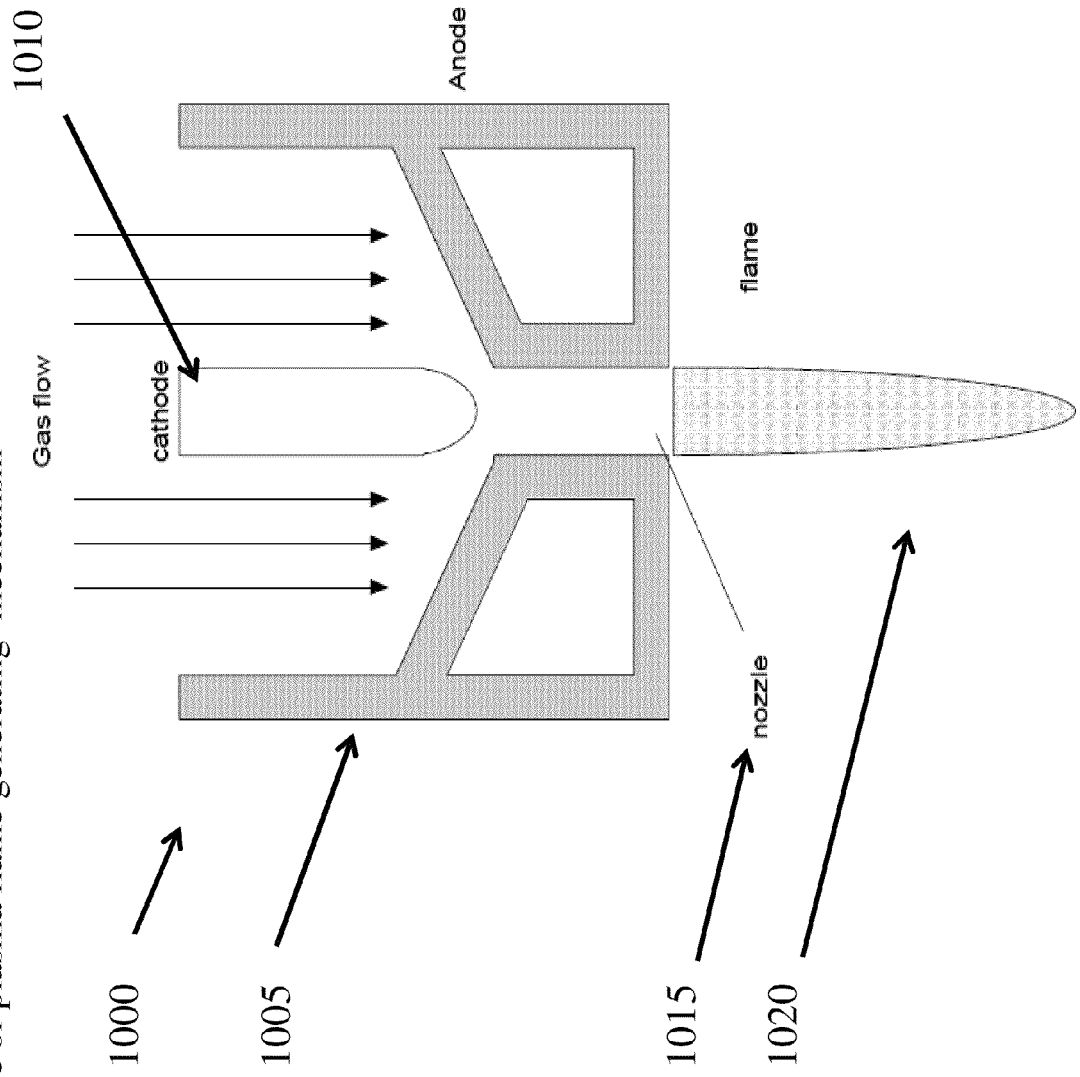
FIG. 1 Schematic structure of plasma flame generating mechanism.

One embodiment comprises deposition by high-purity plasma spray of one or more layers of silicon and/or dielectric. The generation of high temperature plasma is typically done with argon, although other gases can be used. Passing a high current, on the order of 500 amperes, through the argon gas, between the cathode 1010 and anode 1005 generates a plasma 1020. This current heats the argon and strips the argon of its electrons. The flow of the plasma exiting nozzle 1015 is determined by the flow of the gas feed into the plasma generator (plasma gun or plasma torch 1000); note FIG. 1. Typical flow rates for commercial plasma guns such as Sulzer Metco 9B gun are on the order of 100+ SCFH at an input pressure of 75 psig. Frequently it is advantageous to mix a secondary gas in with the primary plasma gas to promote higher temperatures. Typical secondary gasses to work with argon are hydrogen and helium. Typically the mix of the secondary gas will be at around 10% of the primary gas flow rate. U.S. Applications 2008/0054106 and 2008/0220558, incorporated by reference herein in their entirety, contain more detailed information.

Figure 2:
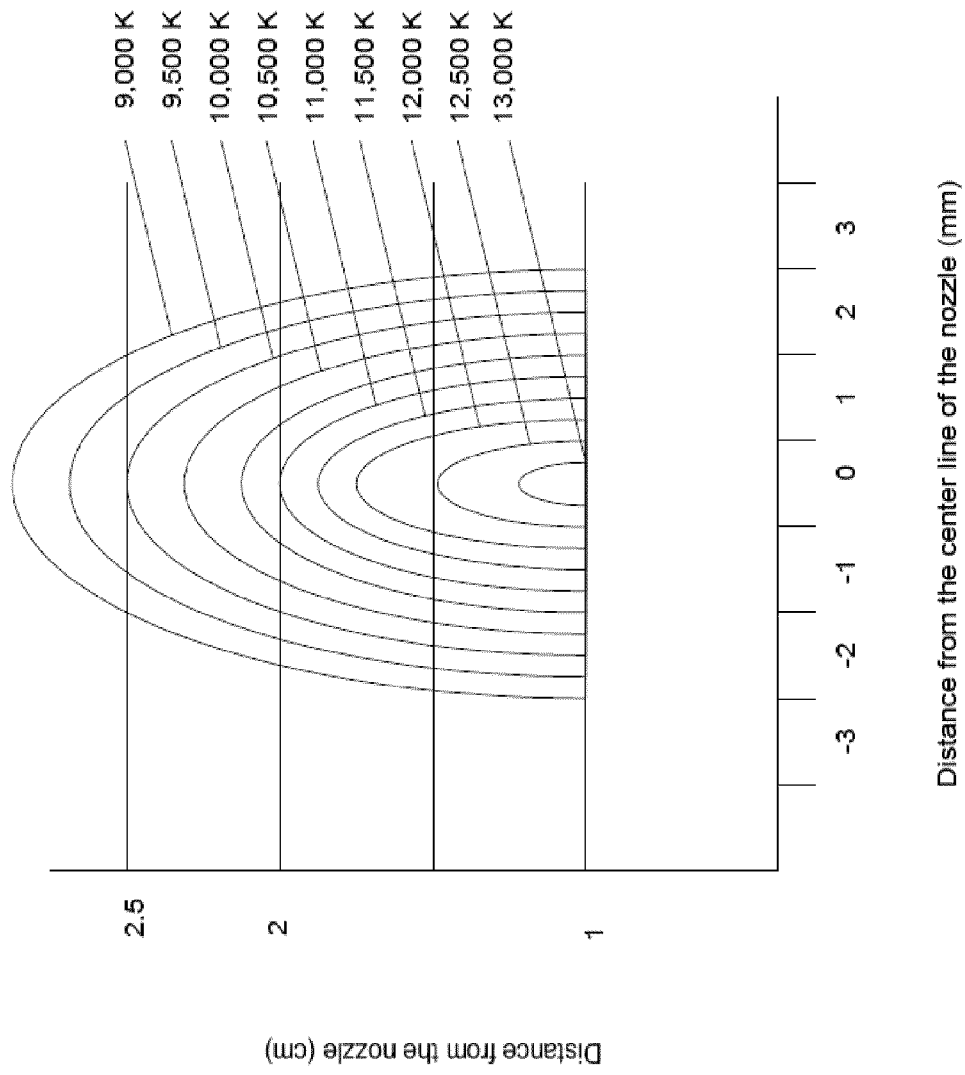
FIG. 2 Exemplary temperature profile of a plasma flame.

The resultant temperature distribution, as shown in FIG. 2, of the plasma flame generated in this fashion will be on the order of 10,000-15,000° K in the central core of the plasma, gradually cooling down as the distance from the nozzle increases. It is worth comparing the core temperature of the plasma to the temperature on the surface of the sun, which is approximately 6,500° K.

This high temperature enables the plasma as a deposition tool. The plasma is flowing at a very high velocity, which imparts a great deal of momentum to any particles entering into the plasma flow. The high temperature melts particles entering into the plasma flow. By injecting silicon powder with particles on the order of 3-100 microns in diameter into the plasma flow, the particles melt and are propelled at high velocity towards a target to be coated. The molten droplets will impinge, or splat, and solidify on the surface of a target and rapidly coat the surface. Compared to standard chemical vapor deposition (CVD) processes, which can grow clean layers of silicon on a substrate at a typical rate of microns/ minute, plasma spray can deposit silicon on a substrate at a rate of tens of microns/sec. The difference between the slow growth of silicon films using CVD and the rapid growth of silicon films using plasma spray is in the quality of the film. A process using CVD will grow a dense, void free layer of silicon; whereas by the nature of the overlaying of splats in a plasma spray process, there is some residual memory of the splats in the layer, whether that is defined by voids, or, in the most ideal deposition, some domain nucleation that is still linked to the original molten droplet.

Although this embodiment has discussed plasma spray deposition of Si on graphite, other embodiments include CVD deposition in its various forms such as Low Pressure CVD, Plasma Enhanced CVD, High Density Plasma CVD, Atmospheric Pressure CVD, PVD, and other forms of Si deposition known to one knowledgeable in the art.

In addition to eliminating the voids, and the nucleation linked to the original splats, there is a need to increase the size of the crystal domains in order to increase the diffusion length of carriers in the solar cell. The concept of minority carrier lifetime is strongly linked to solar cell efficiency.

A solar cell can be explained in a simplified fashion as the equivalent of a semiconductor diode circuit. This means that two differently doped types of silicon are brought into contact with one another; one type is p and the other is n type. At a boundary between n and p types, mobile electrons diffuse into the p side and mobile holes diffuse into the n side. At the interface the holes and electrons recombine. This leaves positive charge on the n side, and a negative charge at the p side, and a region depleted of holes and electrons in between those two charged areas. As this charge grows, it becomes more and more difficult for electrons to diffuse into the p type material, because the negative charge at the boundary repels the flow of electrons. Similarly, it becomes more and more difficult for holes to diffuse into the n side, because the positive charge at the boundary repels the holes. In fact in order for a current to flow across the boundary, an electromotive force, or voltage needs to be applied to enable the flow of holes and electrons. If the voltage is applied in one direction, all that is accomplished is to make the positive boundary on the n side stronger and the negative boundary on the p side stronger, preventing the flow of charges across the boundary. When the voltage is applied in the correct polarity, it reduces the strength of the positive boundary on the n side, and the negative boundary on the p side, allowing, once again, electrons and holes to flow across the boundary. Hence the p-n junction acts as a diode, allowing current to flow only when a voltage is applied in the correct polarity.

In the absence of an external electromotive force on the junction, the junction itself acts as a small electromotive force on any mobile holes and electrons. A field is generated that will apply a force to the holes and electrons. When light of a correct energy strikes this device it causes the generation of a hole and an electron. Both the hole and electron will feel the force of the field. Assume that the hole and electron are generated in the n side of the device. Since it is n type silicon, the mobile charge carriers are electrons; there are very few free holes to move around. Hence the hole that was just generated by the incident light is in the minority. In fact, a free moving hole in the n type material is referred to as a minority carrier. In a closed circuit with a load on it, we will find the electron generated by light attracted to the positive field in the junction. The hole will begin to flow through the circuit in order to flow around to the p side. In an ideal and greatly simplified world, the generated electron would move towards one of the positively charged atoms at the junction, and make it neutral again. The hole would flow through the circuit to reenter the p side and recombine with negatively charged atoms to make it neutral. This would reduce the strength of the junction and allow another hole to diffuse to the n side while an electron will diffuse to the p side. The hole and electron will recombine, restoring the junction field to where it was before light created the electron-hole pair. In reality, the hole that was generated by light in the n side of the junction is a very small minority in a region with many mobile electrons. That hole will flow some distance before it will be trapped by an electron. The time that the hole remains alive is referred to as the minority carrier lifetime. The lifetime of the minority carrier, whether it is a hole in an n type material, or an electron in a p type material, needs to be long enough to be collected by the electrical circuit and contribute to the photocurrent. Limitations to this lifetime or diffusion length are crystal domain size and contaminants in the crystal. Crystal domain size is important because contaminants that can trap minority carriers are pushed out to the periphery of the crystal domain during a recrystallization process. Lower level of contaminants and larger grain sizes are indicative of greater minority carrier lifetime, which is required for higher solar cell efficiency.

While contaminant reduction can be achieved by care in the cell manufacturing process, crystal size needs to be addressed separately. One embodiment of the technology consists of deposition of silicon by plasma spray. An as-deposited silicon layer consists of micro-crystals, typically much smaller than the droplets splattered by the plasma spray; it is sufficient to recrystallize silicon droplets into crystals or grain domains on the order of 1-10 millimeters in a lateral dimension; optionally lateral grain sizes may vary from 0.01 microns to 100 microns or larger.

A method of Zone Melt Recrystallisation (ZMR) disclosed in U.S. Ser. No. 12/789,357 enables silicon recrystallization by selectively heating a narrow line of the silicon layer to a temperature around the silicon melting point of 1410° C. The line heating the silicon above melting slowly moves across the surface of the layer. As the heating line progresses the, the heated silicon melts, while the previously heated line slowly solidifies. As it solidifies, the silicon configures itself in the same crystal orientation as the previously molten section. Depending on the speed of the heating line across the surface, one can control the quality of the recrystallization of the silicon surface and achieve the required MCL and cell efficiency.

Multiple methods of ZMR exist, but a common theme is to create a uniform bottom side heater, and then generate the "zone" heating with some form of line heater. Most common line heaters are focused high intensity halogen lamps, or graphite strip heaters. Bottom heaters are typically arrays of halogen lamps, although other alternatives might include inductive heaters, or silicon carbide glo-rods such as sold by Kanthal Globar (Amherst, N.Y.).

One of the key aspects of the implementation of this technology is the substrate upon which the active silicon material is deposited. An ideal substrate material would be non-contaminating so as not to reduce the efficiency of the solar cell; yet conductive in order to easily complete the solar cell circuitry. Much work has been done using silicon as a substrate. There are two primary considerations against using silicon. First, the cost of silicon is relatively high. While 250 microns might not seem like much silicon, little efficiency is gained by having an active layer greater than 25-30 microns thick, therefore much of the material is wasted for mechanical support. A second disadvantage of silicon is its rigidity. There is significant economic advantage to the manufacturing process of solar cells on a roll of foil. There is no clear methodology yet for producing silicon foil for solar cell manufacture.

In comparison, graphite is an inexpensive, conductive, and, after proper purification, non-contaminating material as a substrate for solar cell manufacture. The kerf losses of generating 250 micron graphite, while still wasteful, are much less expensive than the same losses in silicon. Additionally, graphite can be manufactured into a foil for roll-to-roll manufacturing.

There remain a number of issues with graphite that have prevented its use as a common substrate for photovoltaic applications. These primary problems are purity, surface adhesion, and interlayer cohesion. Pure graphite (pure carbon) is non contaminating. Unfortunately, purity of the graphite, at the current state of the art, is problematic. High purity graphite achieves 5 ppm by weight of non-carbon matter. This requires some form of barrier layer to prevent diffusion of contaminants into the solar cell. One example of an acceptable barrier layers is silicon carbide, applied as a layer of silicon onto the surface of the graphite, and then formed by a thermal process.

Graphite itself comes from two possible sources, natural or synthetic graphite. Synthetic graphite is carbon that undergoes a graphitization process. Graphitization occurs by heating the bulk carbon to around 3,000° C. in an inert environment using resistive heating. During this process the atoms organize themselves into a crystalline format of graphite. Similar to graphitization is graphite purification where graphite is baked in a halogen environment to 3,000° C. Purification of this type can achieve to 5 ppm of impurities.

One characteristic of graphite, synthetic or natural, is its porosity. Porosity is a physical trap for contaminants, and can prevent deposition of a smooth uniform layer of silicon on the graphite. There are a number of solutions known to the art for eliminating the porosity of graphite; glassy graphite manufacture, impregnated graphite, and pyrolytic graphite are well known solutions.

Figure 3:
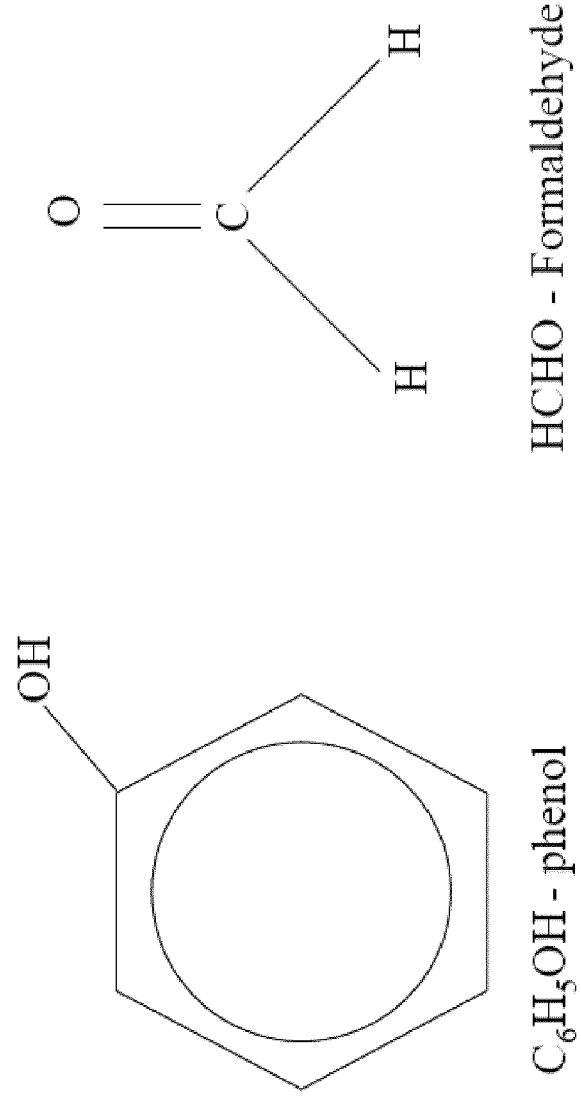
FIG. 3 Exemplary building blocks of a phenolic resin.
Figure 4:
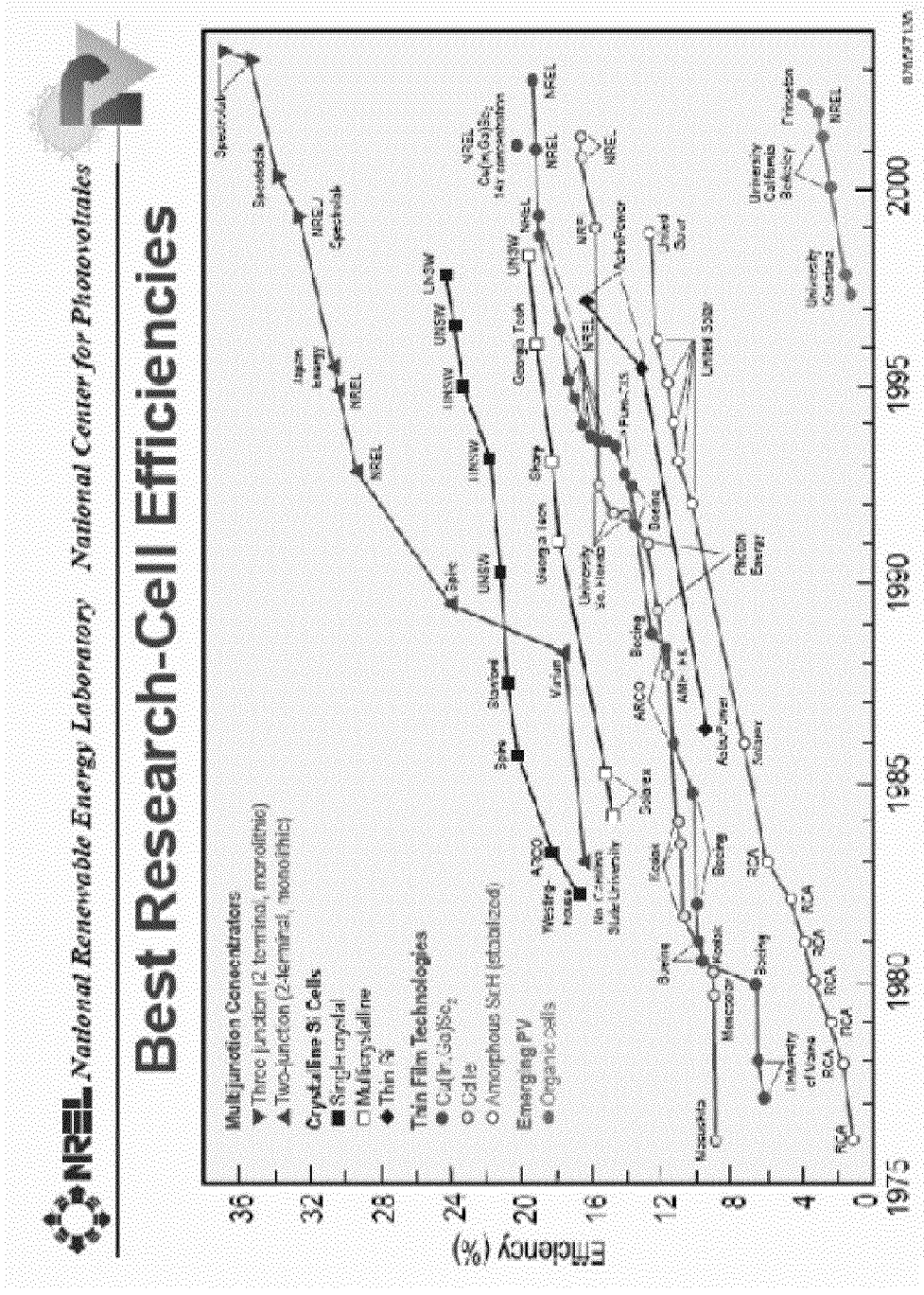
FIG. 4 NREL Best research-cell efficiencies.

Glassy graphite is a dense, non porous graphite made initially from a cast phenolic resin. Phenolic resin is created from the polymerization of phenols and aldehydes; Note FIG. 3. The cast resin is hardened and then machined to the end shape. At this point the resin is carbonized at around 1,500° C. for 12 to 20 hours, and then cleaned. Glassy graphite still suffers from silicon adherence and layer cohesion, but solves the problem of surface uniformity.

A method that helps adherence and uniformity and can be used with glassy graphite is impregnation. Impregnation consists of coating the surface of the graphite with a material and then carbonizing it. Typical materials that can be used are resins, including the resins used for creating glassy graphite, acrylic resins and epoxies, metals and metal alloys, hydrocarbons, such as oils, paraffins, and greases. Also salts and salt solutions can be used. The advantage of impregnation is that the impregnating material can be used to control physical parameters of the substrate such as coefficient of thermal expansion (CTE). Mismatch of coefficient of thermal expansion is the major cause of poor adhesion to the graphite surface. By appropriate impregnation CTE can be controlled and silicon adhesion to the surface achieved. Additionally, impregnation can improve the internal cohesion of graphite and create a barrier layer against impurities. Resins and some metals, such as aluminum, are used to alter the thermal expansion coefficient of graphite and bring the TCE closer to silicon so that delamination of deposited layers from a graphite substrate is minimized An example of an impregnation process is calcination where a sheet or plate of graphite is immersed in an aqueous solution of zirconium acetate at 500 psi and 20° C. for 30 minutes. During the immersion, the aqueous solution seeps into the porous graphite plate. The impregnated plate is air dried for 1 hour at 150° C. after which the plate is immersed in ammonium hydroxide solution to convert the zirconium acetate to zirconium oxide. Once again the plate is air dried, this time for 3 hours at 150° C. Once the drying process is completed, the plate is heated to 2,200° C. for 1 hour in argon during which time oxygen is released by zirconium and replaced with carbon resulting in impregnation with zirconium carbide An example of a gaseous phase impregnation is based on the reaction

$$SiO+2C \rightarrow SiC+CO \qquad (1)$$

SiC and $SiO_2$ powder are mixed in a crucible adjacent to a graphite target. The material is heated to 2,000° C. in an argon environment. The SiC and $SiO_2$ react to generate gaseous SiO. The gas permeates the porous graphite target. The SiO reacts with the graphite to impregnate graphite with SiC.

Another barrier layer method is deposition of pyrolytic carbon on the graphite substrate. Pyrolytic carbon is a chemical vapor deposition method for carbon. Typically pyrolytic carbon is generated by flowing a hydrocarbon into a chamber at very high temperature. In the absence of oxygen, they hydrocarbon cracks into pure carbon and hydrogen gas. The carbon coats the graphite substrate and leaves a dense layer of pure carbon on the substrate. Alternative impregnation materials can be used to match the CTE with silicon to enable good silicon adhesion to the substrate. One example of a pyrolytic process is to flow methane in a reducing environment above 1,500° C. over a graphite substrate; deposition rates above 0.5 microns/min. are achievable.

Graphite foils are manufactured from natural graphite. Bits of graphite undergo a process called "expanding" where graphite is immersed first in chromic acid and then in concentrated sulfuric acid. This process expands the distance between the planes of the graphite crystal. A very light and fluffy graphite is generated which can then be rolled together into sheet form. A process called "calendaring", similar to the process of rolling sheet paper from wood pulp, is used create a graphite foil as thin as 15 microns. The graphite foil can undergo all of the processes of impregnation and glassification mentioned before to create a substrate suitable for silicon deposition.

Additionally, graphite foil can be created and rolled simultaneously with a phenolic resin or any impregnating material and processed appropriately to create a "glassy foil" or an "impregnated foil". In doing this, the process is simplified for producing a foil with the requisite characteristics for silicon adhesion for the manufacture of solar cells.

The advantage of working with graphite foil is that a very effective continuous manufacturing process based on roll to roll processing can be implemented for solar cell manufacture. Cells can be manufactured to any desired dimension, and process throughput can be optimized. Processing solar cells by deposition of silicon on graphite foils, constitutes a novel approach to high efficiency, low cost solar cell manufacture.

As described herein, a barrier layer provides one or more of the following benefits: a) reduce contamination from a substrate moving into an active layer so that the efficiency of a device, such as a solar cell, is not substantially reduced; b) function as a DBR and increase reflection from the back surface of a photoactive material back into a solar cell, increasing the absorption of light in a photoactive region resulting in higher efficiency; c) minimize back surface carrier recombination which reduces the efficiency in a solar cell.

The instant invention discloses a substrate barrier layer 104, a semiconductor barrier layer 330, and a $3^{rd}$ barrier layer 331; each of the disclosed barrier layers may have multiple functions and each may be of a different composition depending upon the primary and secondary functions. For example substrate barrier layer 104 prevents contaminates from reaching the active region of a PV device; barrier layer 104 may also function as a distributed Bragg reflector to reflect light back to an active region; similarly $3^{rd}$ barrier layer 331 may function as an anti-reflection layer. Semiconductor barrier layer 330 with vias 335 functions to separate first semiconductor layer 110 from second semiconductor layer 120 and provide "regions", the vias, wherein p-n junctions are formed. The barrier layer via process is controlled such that the overall surface area of the vias accounts for about 15% of the surface area of the barrier layer. In some embodiments the area ratio of the vias to the barrier layer is between about 1% to about 20%; in other words, of the active region area of a given PV device in contact with a layer comprising barrier material 330 and vias 335, between about 1% to about 20% of the area may be vias and the balance is barrier. This enables acceptable current collection while still maintaining acceptable performance of the barrier layer functionality.

Figure 5:
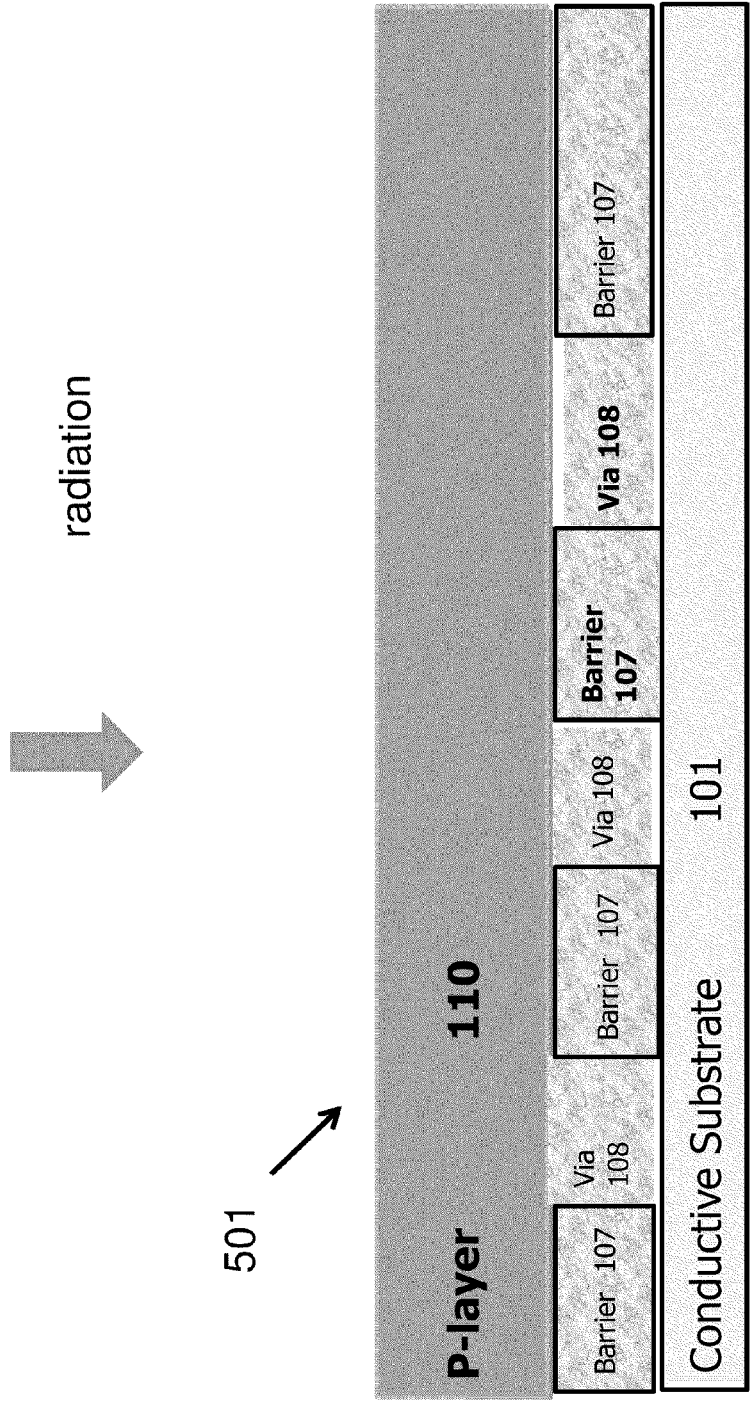
FIG. 5 is a schematic drawing of a first embodiment.

Several embodiments of the instant invention are shown in FIGS. 5-9; one embodiment is the solar cell device structure 501 of FIG. 5. The substrate layer of the cell is conductive, optionally, graphite 101. By using a graphite substrate the cell-to-cell connections in a module are greatly simplified. Graphite can be impregnated or coated with materials such as resins, aluminum, silicon and metallurgical grade silicon to create a better match to the coefficient of thermal expansion of silicon and remain conductive. This matching in CTE creates a more robust bond between the layers, and reduces the likelihood of the silicon layer from peeling off the substrate. A barrier layer 107 overcoats a conductive substrate 101; vias 108 are formed through the barrier layer, optionally, by laser ablation. In one embodiment a p-layer is deposited by plasma spray, filling the vias and making electrical connection to the substrate. Subsequent processing completes a photovoltaic device.

Figure 6:
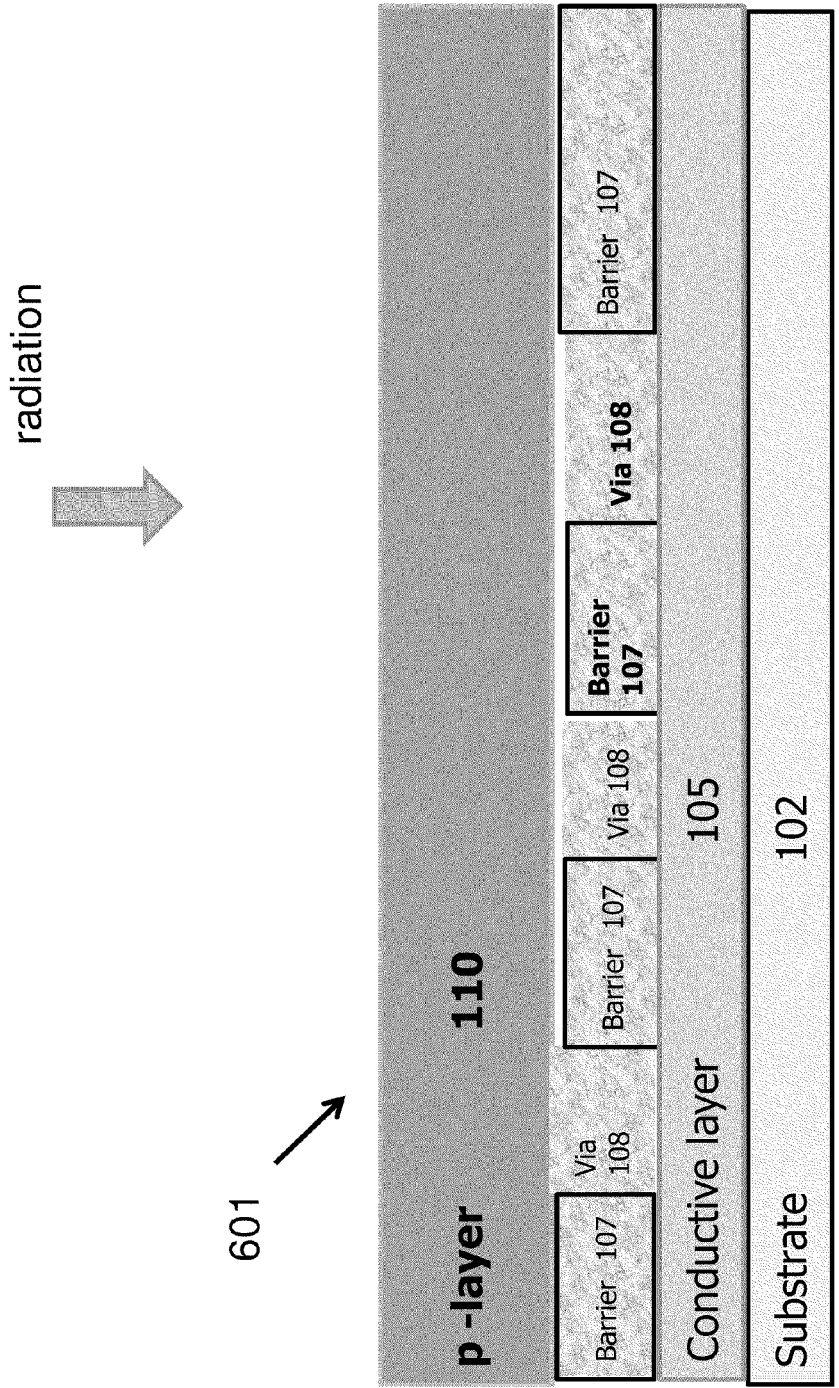
FIG. 6 is a schematic drawing of a second embodiment.
Figure 7:
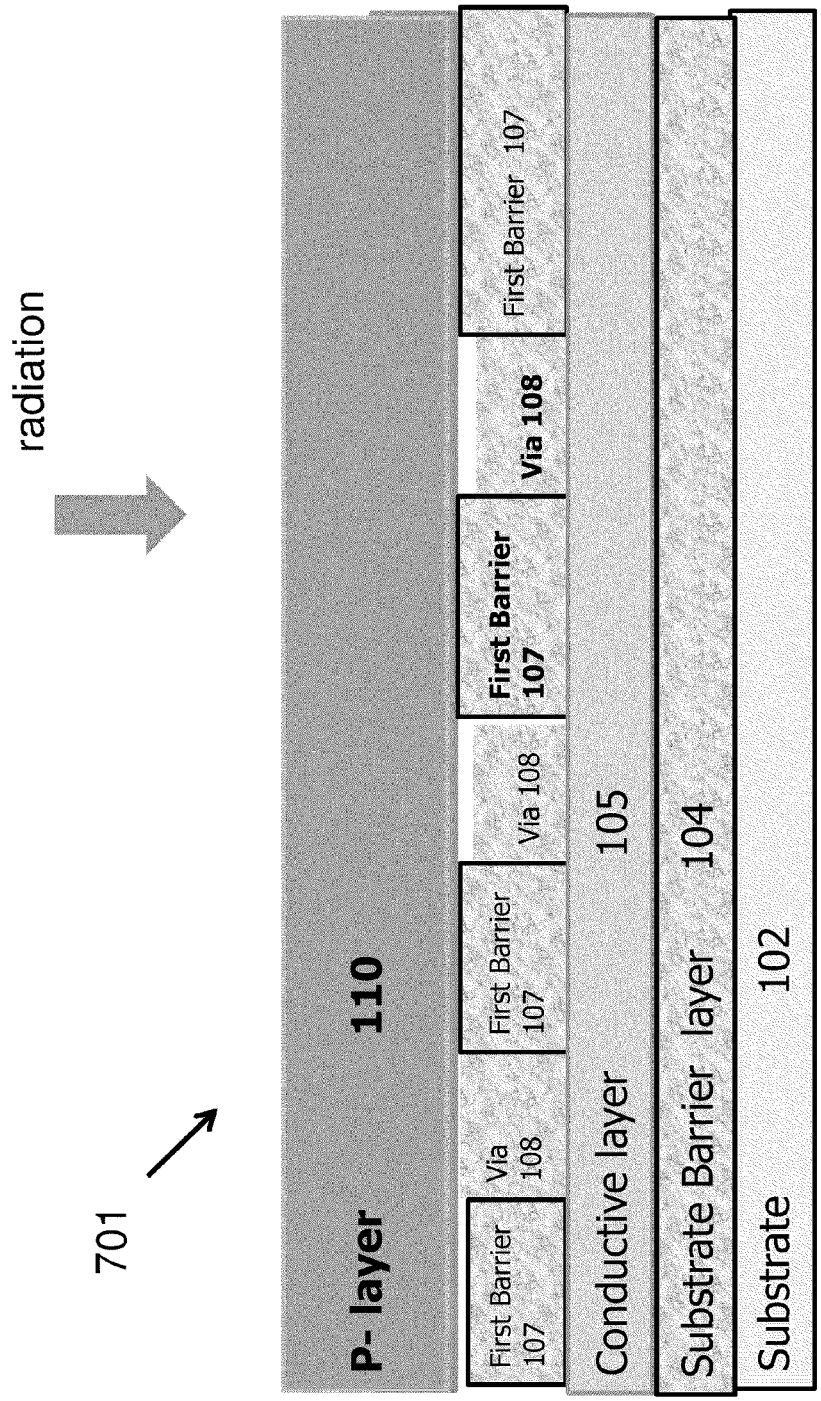
FIG. 7 is a schematic drawing of a third embodiment.
Figure 8:
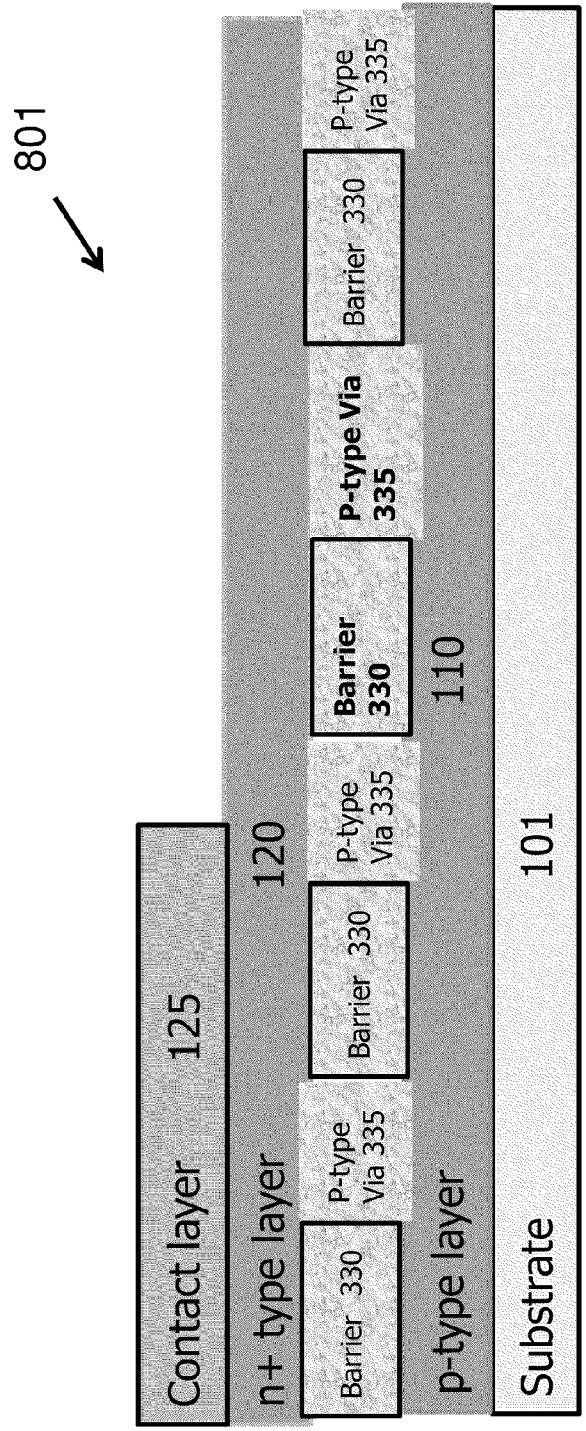
FIG. 8 is a schematic drawing of a fourth embodiment.
Figure 9:
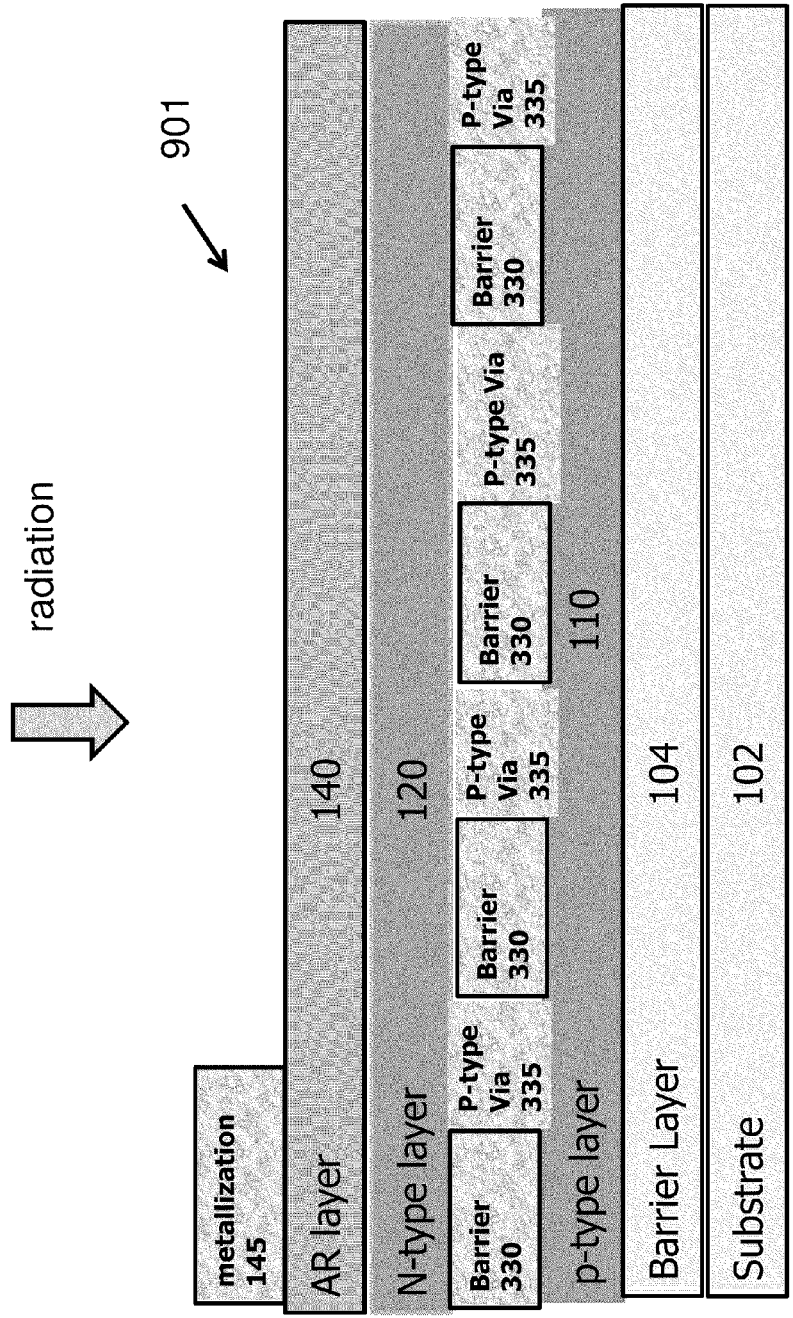
FIG. 9 is a schematic drawing of a fifth embodiment.

In one embodiment, shown in FIG. 6 as 601, a substrate is coated with a thin layer of highly conductive silicon 105 to act as a contact layer and as an interface with the active silicon solar cell such that there is no backside junction, which will result in lower back surface recombination probability in the completed cell. The highly conductive silicon is then coated with a barrier layer 107, which, in one embodiment of the patent is silicon dioxide.

In order to enable current collection from the solar cell there needs to be a path through the substrate dielectric to a conductive substrate 101. This is accomplished by generating a pattern of small holes or vias through barrier layer 107. Holes can be generated, for example, by lithographic process and etch or by ablation using a laser beam. The beam can scan across the surface and be modulated in power to create a grid of vias 108.

The solar cell is completed in normal fashion, creating an p-n junction, optionally a n-p junction, and then passivated, in one embodiment, by a thin layer of silicon nitride. In a next operation, silver contacts are deposited and driven into or, optionally fired through, the silicon nitride. Holes in the dielectric may act as a pass through for the silver when it is driven into the material. The use of a conductive substrate and conductive paths in the barrier layer enable contact with the back layer of the solar cell from the top surface.

While the embodiment discussed above refers to a conductive graphite substrate, alternative substrates include non-conducting graphite substrates with a conductive coating, or substrates of material other than graphite such as glass, alumina, metallic foils, carbide coated substrates, a substrate may have a protective overcoating layer such as mullite, $Al_6Si_2O_{13}$, or a mullite plus yttria stabilized zirconia (YSZ) overcoat compositionally graded to improve thermal expansion matching with silicon.

While the embodiment discussed herein referred to a layer of highly conductive p++silicon on the substrate, in other embodiments a highly conductive layer on the substrate could be n++type silicon when the main absorbing layer is of n-type and the photoactive junction requires n type backside doping.

In some embodiments a barrier layer comprises one or more layers wherein one of the layers is of composition chosen from a group consisting of $SiO_2$, $Al_2O_3$, TaN, $TiO_2$, silicon carbides, silicon nitrides, silicon oxides, metal oxides, metal carbides, and metal nitrides, conductive and non-conducting ceramics and graphite based materials.

In some embodiments a layer of high purity silicon 110, optionally n-type or p-type, is deposited on a substrate 101 or 102, optionally flexible, such as stainless steel sheet, graphite foil, flexible foil coated with graphite, stainless steel sheet coated with graphite or other material suitable for roll-to-roll deposition. This high purity silicon layer may be in the range of about 0.01 to more than 100 microns thick. A deposition process may be any method or combination of methods, including CVD, PVD, MOCVD, PECVD, RF-PECVD and high-purity plasma spraying and others known to one knowledgeable in the art.

In some embodiments the deposited n-type or p-type silicon layer is recrystallized to form the light-absorbing layer of the solar cell. The deposited silicon layer is, optionally, recrystallized at high temperature to increase the crystal grain size and to improve its electrical characteristics. The recrystallization process can be accomplished by means of laser, IR heating, RF heating, resistive heating, or combinations of these. In some embodiments a "cap layer" of thin silicon nitride or thin silicon oxide is formed on the n-type, optionally, p-type, silicon before or during recrystallization; optionally, this layer is formed in lieu of recrystallization. A cap layer, 111 may be formed by exposing the n-type silicon to a nitriding or oxidizing ambient at an appropriate elevated temperature; optionally, a cap layer may be deposited.

In some embodiments a recrystallization process may occur in a gaseous atmosphere such as oxygen or nitrogen that is conducive to forming a capping layer on the top surface of the recrystallized n-type silicon layer; alternatively, a reducing atmosphere may be used; alternatively, helium or hydrogen may be added to improve thermal conductivity of the atmosphere.

In some embodiments in addition to the capping layer, a first semiconductor barrier layer 330 consisting of an oxide, a nitride, a carbide, or a combination of these, can be applied, to the, optionally, recrystallized n-type. An optional capping layer and a first barrier layer can be structured to have vias through the layer(s) at regular intervals. Vias may be formed by laser machining, lithography or by other physical means. In addition to these intentional means, random vias, such as from pinholes, may be obtained through this first barrier layer. The density of vias, whether by laser machining, lithography, or by random pinhole, is sufficient to minimize series resistance losses through this first barrier layer.

In some embodiments, a p++ and/or p+ silicon layer(s), 120, is (are) deposited on top of the recrystallized n-type silicon substrate combination; optionally, a capping and/or first barrier layers may be present at the deposition surface. The purpose of this p++(or p+) silicon layer is to ultimately form rectifying p-n junctions. The junction can be formed by thermal diffusion of p-type dopant into the n-type layer, or by ion implantation or by a deposition step. The heat of deposition of this p++ (or p+) silicon layer may by itself be sufficient to form a rectifying junction. Optionally, a subsequent heating step can be used to form or to complete the rectifying p-n junction. Optionally, a p++ and/or p+ silicon layer(s) is deposited first 110 and n-type, 120 is deposited second.

In some embodiments a silicon, or other semiconductor, layer, as deposited is amorphous, nano-crystalline, micro-crystalline, or macro-crystalline; in some embodiments the layer is hydrogenated, for example, Si:H; alternatively, nc-Si:H. In some embodiments a silicon, or other semiconductor, layer, after recrystallization is nano-crystalline, micro-crystalline, or macro-crystalline; in some embodiments a semiconductor layer is hydrogenated, such as Si:H; alternatively, nc-Si:H, nano-crystalline hydrogenated silicon. In some embodiments a recrystallized, deposited semiconductor layer exhibits a minority carrier diffusion length greater than a grain size lateral dimension and a grain size lateral dimension larger than the deposited material layer thickness; optionally, a deposited material layer thickness may vary from about 0.01 microns to about 100 microns. In some embodiments a deposited semiconductor layer is chosen substantially from a group consisting of silicon, germanium, silicon-germanium alloys, Group IV elements or compounds, Group III-V compounds and Group II-VI compounds.

In some embodiments a silicon, or germanium or a SiGe compound semiconductor layer is in a state of strain such that it has a direct band gap. For a silicon layer strain may be induced by alloying with germanium and/or carbon; alternatively strain may be induced by a deposited layer of different thermal expansion coefficient in proximity to the semiconductor layer.

In some embodiments a third barrier layer, 331, is deposited onto a p+/p++/n-base. The purpose of this layer is to isolate the active layers from the subsequently applied contact layer, 125. The second barrier layer may comprise an oxide, a nitride, a carbide, or a combination of these. As with the first barrier layer, the density of optional vias, 336, whether by laser machining or by alternative, will be sufficient to minimize series resistance losses through the barrier layer. Second semiconductor barrier layer, 331, may be of conductive material like TiN or doped SiC, and conducting vias, 336 are optional.

In some embodiments a metal-bondable aluminum or solderable metal may be deposited onto the layered structure to form an electrical contact. In some embodiments a second barrier layer may, optionally, be operable as a distributed Bragg reflector, DBR, to reflect at least a portion of any transmitted radiation back into the active region. In some embodiments a substrate may have a protective overcoating layer such as mullite, $A_{16}S_{i2O13}$, or a mullite plus yttria stabilised zirconia (YSZ) overcoat, compositionally graded to improve thermal expansion matching with silicon.

In some embodiments a solar cell also comprises a surface passivation layer, optionally, an antireflection coating 140 and, optionally, contact metallizations 145, added to the top-side, where the top-side is the surface where radiation enters the device initially. Conventional contact metallizations that are commonly used for crystalline silicon solar cells can be applied to this structure.

FIG. 10 shows how various photovoltaic structures may be configured. All structures and processes have the "required layers" and steps. The instant invention discloses the various structures comprising various combinations of the optional layers from no optional layers up to and including all of the optional layers and or process steps.

In some embodiments, in a device the top layer is n-type silicon; optionally, a n-type diffusion is used, together with a passivating oxide or alone, to reduce front surface recombination. The advantage of the disclosed junction structure is that a high resistivity, highly transparent n-type diffusion is sufficient for surface passivation, and there is no interference by a passivating oxide to the antireflection coating. Another advantage of this structure is that it is very tolerant of lower-quality and/or lower minority-carrier lifetime silicon. Another advantage of this design is that the base layer is n-type, which adds to its tolerance of metallic impurities. Optionally, an anti-reflection layer and/or a metallization layer 145 may be added; in some embodiments layer 140 is silicon nitride or titanium dioxide and a "fire-through" process is used in conjunction with a screen printed metallization layer so as to avoid making explicit vias in layer 140.

In some embodiments a process for manufacturing a photovoltaic device on a substrate comprises the steps: depositing a first semiconductor layer of a first conductivity type onto a substrate; depositing a second semiconductor layer of a second conductivity type onto the first semiconductor layer; optionally, applying a first conductive layer onto the second semiconductor layer; optionally, additional steps comprising one or more of the following may be added and/or inserted: recrystallizing the first semiconductor layer before depositing a second semiconductor layer of a second conductivity type onto the first layer, depositing a substrate barrier layer onto the substrate such that the substrate barrier layer is between the substrate and the first semiconductor layer; optionally, the first and second semiconductor layers comprise a Group IV, III-V or II-VI semiconductor; optionally, additional steps comprising one or more of the following may be added: depositing a first barrier layer, optionally reflective, on the first semiconductor layer; and forming vias in the first barrier layer such that area fraction of vias in the first barrier is between about 0.01 and 0.20, wherein the additional steps are done just prior to depositing a second semiconductor layer of a second conductivity type onto the first layer; forming at least one p-n junction between the first and second semiconductor layers about the vias wherein the additional step is done just after the depositing a second semiconductor layer of a second conductivity type onto the first layer; forming a cap layer consisting of silicon nitride or silicon oxide on top of the first semiconductor layer before depositing a second semiconductor layer; adding a second barrier layer between the second semiconductor layer and the first conductive layer; forming vias in the second barrier layer.

In some embodiments a process for manufacturing a photovoltaic device on a substrate comprises the steps: depositing a first transparent, optionally reflective and/or conductive, barrier layer onto a substrate; depositing a first semiconductor layer of a first conductivity type onto the first transparent barrier layer; depositing a second semiconductor layer of a second conductivity type onto the first semiconductor layer, wherein the means for depositing the first or second semiconductor layer comprises a high-purity plasma spray; applying a first conductive layer onto the second semiconductor layer; optionally, an additional step may be added comprising recrystallizing the first semiconductor layer before depositing a second semiconductor layer of a second conductivity type onto the first semiconductor layer.

In some embodiments a process for manufacturing a photovoltaic device on a substrate comprises the steps: depositing a substrate barrier, optionally a reflective layer also, onto a substrate; depositing a first semiconductor layer of a first conductivity type onto the first transparent barrier layer; forming a cap layer on the first semiconductor layer; depositing a second semiconductor layer of a second conductivity type onto the cap layer, wherein the means for depositing the first or second semiconductor layer comprises a high-purity plasma spray; and applying a first conductive layer onto the second semiconductor layer; optional additional layers may be interspersed as indicated in FIG. 10.

In some embodiments a photovoltaic device structure for converting incident radiation into electrical energy comprises: a substrate, 101 or 102; a first barrier layer 107 comprising vias 108 through the first barrier layer in a predetermined pattern; and a first semiconductor layer 110 of first conductivity wherein the first barrier layer separates the first semiconductor layer from the substrate and the vias provide an electrical connection between the first semiconductor layer and the substrate; optionally, the device further comprises a conductive layer 105 between the barrier layer and the substrate wherein the vias provide an electrical connection between the first semiconductor layer and the conductive layer; optionally, the substrate is chosen from a group consisting of graphite, graphite foil, glassy graphite, impregnated graphite, pyrolytic carbon, pyrolytic carbon coated graphite, flexible foil coated with graphite, carbon, glass, alumina, and carbide coated substrates; optionally, the conductive layer is chosen from a group consisting of silicon, SiC, conductive metal nitride, aluminum, copper, silver, transparent metal alloy and transparent conductive metal oxide and combinations thereof; optionally, the first barrier layer comprises one or more layers; optionally, at least one of the one or more layers of the first barrier layer is of composition chosen from a group consisting of $SiO_2$, $Al_2O_3$, TaN, $TiO_2$, silicon carbides, silicon nitrides, metal oxides, metal carbides, metal nitrides and conductive and non-conducting ceramics optionally, the substrate is flexible optionally, the first barrier layer comprises a distributed Bragg reflector; optionally, the device further comprises a cap layer on the first semiconductor layer; a semiconductor barrier layer comprising vias; and a second semiconductor layer of second conductivity wherein the semiconductor barrier layer comprises vias separating the cap layer from the second semiconductor layer and the second semiconductor layer fills the vias optionally, the area ratio of the vias to the semiconductor barrier layer is between about 1% to about 20%; optionally, the first semiconductor layer is recrystallized with a lateral grain size greater than about 0.01 microns; optionally, the first and second semiconductor layers comprise a Group IV, III-V or II-VI semiconductor; optionally, the device further comprises multiple p-n junctions between the first and second semiconductor layers about the vias.

In some embodiments a photovoltaic device operable to convert incident radiation into electrical energy comprises: a substrate; a first reflective layer on the substrate; a first semiconductor layer of a first conductivity type onto the first reflective layer; a second semiconductor layer of a second conductivity type on the first semiconductor layer; wherein the first or second semiconductor layer is formed by a high-purity plasma spray; and wherein the interface between the first semiconductor layer and the second semiconductor layer forms an active region operable to convert incident radiation into electrical energy; optionally, the first reflective layer on the substrate comprises a plurality of layers of a composition chosen from a group consisting of $SiO_2$, $Al_2O_3$, TaN, $TiO_2$, SiC, metal oxides, metal carbides, metal nitrides, SixNy, and porous materials such that a first portion of the plurality of layers is operable as a distributed Bragg reflector and a second portion of the plurality of layers is conductive; wherein x+y≦7 and at least one of x or y is >0. As used herein, "transparent barrier layer" or "transparent" or ""reflective" in general applies to at least some portion of the solar spectrum; a "transparent layer" or "reflective layer" need not be transparent or reflective to the entire solar spectra; rather transparent or reflective to a portion of the spectra qualifies as transparent and reflective.

The foregoing described embodiments of the invention are provided as illustrations and descriptions. They are not intended to limit the invention to a precise form as described. In particular, it is contemplated that functional implementation of invention described herein may be implemented equivalently in various combinations or other functional components or building blocks. Other variations and embodiments are possible in light of above teachings to one knowledgeable in the art of semiconductors, thin film deposition techniques, and materials; it is thus intended that the scope of invention not be limited by this Detailed Description, but rather by Claims following. All patents, patent applications, and other documents referenced herein are incorporated by reference herein in their entirety for all purposes.

In the preceding description, numerous specific details are set forth, such as particular structures, components, materials, dimensions, processing steps and techniques, in order to provide a thorough understanding of the present invention. However, it will be appreciated by one of ordinary skill in the art that the invention may be practiced without these specific details. In other instances, well-known structures or processing steps have not been described in detail in order to avoid obscuring the invention.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

We claim:

1. A photovoltaic device structure for converting incident radiation into electrical energy comprising:
    a substrate;
    a first barrier layer comprising vias through the first barrier layer in a predetermined pattern; and
    a first semiconductor layer of first conductivity wherein the first barrier layer separates the first semiconductor layer from the substrate and the vias provide an electrical connection between the first semiconductor layer and the substrate.

2. The device of claim 1 further comprising a conductive layer between the barrier layer and the substrate wherein the vias provide an electrical connection between the first semiconductor layer and the conductive layer.

3. The device of claim 1 wherein the substrate is chosen from a group consisting of graphite, graphite foil, glassy graphite, impregnated graphite, pyrolytic carbon, pyrolytic carbon coated graphite, flexible foil coated with graphite, carbon, glass, alumina, and carbide coated substrates.

4. The device of claim 2 wherein the conductive layer is chosen from a group consisting of silicon, SiC, conductive metal nitride, aluminum, copper, silver, transparent metal alloy and transparent conductive metal oxide and combinations thereof.

5. The device of claim 1 wherein the first barrier layer comprises one or more layers.

6. The device of claim 5 wherein at least one of the one or more layers of the first barrier layer is of composition chosen from a group consisting of $SiO_2$, $Al_2O_3$, TaN, $TiO_2$, silicon carbides, silicon nitrides, metal oxides, metal carbides, metal nitrides and conductive and non-conducting ceramics.

7. The device of claim 1 wherein the substrate is flexible.

8. The device of claim 5 wherein the first barrier layer comprises a distributed Bragg reflector.

9. The device of claim 1 further comprising;
    a cap layer on the first semiconductor layer;
    a semiconductor barrier layer comprising vias; and
    a second semiconductor layer of second conductivity wherein the semiconductor barrier layer comprising vias separates the cap layer from the second semiconductor layer and the second semiconductor layer fills the vias.

10. The device of claim 9 wherein the area ratio of the vias to the semiconductor barrier layer is between about 1% to about 20%.

11. The device of claim 9 wherein the first semiconductor layer is recrystallized with a lateral grain size greater than about 0.01 microns.

12. The device of claim 9 wherein the first and second semiconductor layers are chosen from a group consisting of Group IV, III-V and II-VI semiconductors.

13. The device of claim 9 further comprising multiple p-n junctions between the first and second semiconductor layers about the vias.

* * * * *